United States Patent
Ikuta et al.

(10) Patent No.: US 10,388,517 B2
(45) Date of Patent: Aug. 20, 2019

(54) EPITAXIAL SUBSTRATE FOR ELECTRONIC DEVICE AND METHOD OF PRODUCING THE SAME

(75) Inventors: Tetsuya Ikuta, Tokyo (JP); Jo Shimizu, Tokyo (JP); Tomohiko Shibata, Tokyo (JP)

(73) Assignee: DOWA ELECTRONICS MATERIALS CO., LTD., Tokyo (JP)

( * ) Notice: Subject to any disclaimer, the term of this patent is extended or adjusted under 35 U.S.C. 154(b) by 198 days.

(21) Appl. No.: 13/550,115

(22) Filed: Jul. 16, 2012

(65) Prior Publication Data

US 2012/0273759 A1 Nov. 1, 2012

Related U.S. Application Data

(63) Continuation of application No. 13/131,411, filed as application No. PCT/JP2009/069896 on Nov. 18, 2009, now abandoned.

(30) Foreign Application Priority Data

Nov. 27, 2008 (JP) .................................. 2008-302620
Nov. 13, 2009 (JP) .................................. 2009-260014

(51) Int. Cl.
*H01L 29/66* (2006.01)
*H01L 21/02* (2006.01)
(Continued)

(52) U.S. Cl.
CPC .... *H01L 21/0254* (2013.01); *H01L 21/02381* (2013.01); *H01L 21/02458* (2013.01);
(Continued)

(58) Field of Classification Search
CPC .................................................. H01L 29/66462
(Continued)

(56) References Cited

U.S. PATENT DOCUMENTS

| 2005/0118752 A1 | 6/2005 | Otsuka et al. |
| 2006/0068601 A1 | 3/2006 | Lee et al. |

(Continued)

FOREIGN PATENT DOCUMENTS

| CN | 1921148 A | 2/2007 |
| JP | A-6-112120 | 4/1994 |

(Continued)

OTHER PUBLICATIONS

Feb. 7, 2014 Office Action issued in European Application No. 13 001 425.1.
(Continued)

*Primary Examiner* — Hsin Yi Hsieh
(74) *Attorney, Agent, or Firm* — Oliff PLC (57) ABSTRACT

An epitaxial substrate for an electronic device, in which a lateral direction of the substrate is defined as a main current conducting direction and a warp configuration of the epitaxial substrate is adequately controlled, as well as a method of producing the epitaxial substrate. Specifically, the epitaxial substrate for an electron device, including: a Si single crystal substrate; and a Group III nitride laminated body formed by epitaxially growing plural Group III nitride layers on the Si single crystal substrate, wherein a lateral direction of the epitaxial substrate is defined as a main current conducting direction, is characterized in that the Si single crystal substrate is a p-type substrate having a specific resistance value of not larger than 0.01 Ω·cm.

3 Claims, 5 Drawing Sheets

(51) Int. Cl.
*H01L 29/737* (2006.01)
*H01L 29/20* (2006.01)

(52) U.S. Cl.
CPC .. *H01L 21/02505* (2013.01); *H01L 21/02507* (2013.01); *H01L 29/66462* (2013.01); *H01L 29/7378* (2013.01); *H01L 29/2003* (2013.01)

(58) Field of Classification Search
USPC .............................. 257/15, 76, 190, E29.024
See application file for complete search history.

(56) References Cited

U.S. PATENT DOCUMENTS

| | | | |
|---|---|---|---|
| 2007/0210329 A1 | 9/2007 | Goto | |
| 2007/0215905 A1 | 9/2007 | Kohiro et al. | |
| 2008/0017952 A1 | 1/2008 | Cody et al. | |
| 2008/0023706 A1 | 1/2008 | Saito et al. | |
| 2008/0203382 A1 | 8/2008 | Yanagihara | |
| 2009/0045438 A1* | 2/2009 | Inoue | H01L 29/155 257/192 |

FOREIGN PATENT DOCUMENTS

| | | |
|---|---|---|
| JP | A-2003-59948 | 2/2003 |
| JP | A-2003-324068 | 11/2003 |
| JP | A-2005-158846 | 6/2005 |
| JP | A-2005-159207 | 6/2005 |
| JP | A-2007-59595 | 3/2007 |
| JP | A-2007-242853 | 9/2007 |
| JP | A-2007-273814 | 10/2007 |
| JP | A-2008-34411 | 2/2008 |
| JP | A-2008-522447 | 6/2008 |
| JP | A-2008-171843 | 7/2008 |
| JP | A-2008-251704 | 10/2008 |

OTHER PUBLICATIONS

Jan. 8, 2013 Notification of Nov. 28, 2012 Submission of Information (by a third party) issued in Japanese Patent Application No. 2010-063185 (with original Submission of Information, and translations of Notification and Submission of Information).
Apr. 23, 2013 Office Action in European Patent Application No. 09 829 111.5.
SEMI MF534-0707, Test Method for Bow of Silicon Wafers, Audits and Reviews Subcommittee, 2007.
SEMI MF 1451-92 (Reapproved 1999), Test Method for Measuring Sori on Silicon Wafers by Automated Noncontact Scanning, 2003.
Sugahara et al., "Role of AlN/GaN Multilayer in Crack-Free GaN Layer Growth on 5" ø Si (111) Substrate," Japanese Journal of Applied Physics; 2004, pp. L 1595-L 1597, vol. 43, No. 12B, The Japan Society of Applied Physics.
Sep. 19, 2012 Extended European Search Report issued in European Patent Application No. EP 09829111.5.
Manual FT-900, NIDEC Corporation, pp. 1-20, Aug. 20, 2013, with English-language translation of pp. 3 and 4.
FT-17/FT-900 Specifications, http://www.nidek-intl.com/products/ft/ft-common_2.html, Aug. 2, 2013.
Natsu et al., "Effects of Support Method and Mechanical Property of 300 mm Silicon Wafer on Sori Measurements," Precision Engineering, vol. 29, No. 1, pp. 19-26, 2005, XP027766645.
Semi M1-302, Specifications for Polished Monocrystalline Silicon Wafers, pp. 1-27, 2002, XP040448387.
Oct. 10, 2013 Office Action issued in European Application No. 09 829 111.5.
Jun. 11, 2013 Extended European Search Report issued in Application No. EP 13001425.1.
International Search Report for International Patent Application No. PCT/JP2009/069896, dated Dec. 28, 2009 (w/ English translation).
Office Action issued in Japanese Patent Application No. 2009-260014 dated Jan. 15, 2010 (with translation).
Jul. 23, 2013 Notification of Reasons for Refusal issued in Japanese Application No. 2010-063185 with English-language translation.
Nov. 25, 2013 Office Action issued in U.S. Appl. No. 13/131,411.
Jan. 23, 2013 Office Action issued in U.S. Appl. No. 13/131,411.
Aug. 9, 2013 Office Action issued in U.S. Appl. No. 13/131,411.
Jul. 30, 2012 Office Action issued in Korean Patent Application No. 10-2011-7013087 (with English Translation).
Nov. 1, 2012 Office Action issued in Chinese Patent Application No. 200980153280.7 (with English translation).
Nov. 1, 2012 Search Report issued in Chinese Patent Application No. 200980153280.7.
Oct. 14, 2013 Taiwanese Office Action issued in Taiwanese Application No. 099115373 with English-language translation.
Jul. 18, 2014 Office Action issued in U.S. Appl. No. 13/131,411.
Nov. 26, 2014 Office Action issued in Korean Application No. 10-2012-7017774 (with English translation).
Dec. 10, 2014 Office Action issued in U.S. Appl. No. 13/131,411.
Nov. 2, 2015 Office Action issued in Chinese Application No. 201310084558.8.
Nov. 17, 2015 Office Action issued in U.S. Appl. No. 13/131,411.
Feb. 17, 2016 Advisory Action issued in U.S. Appl. No. 13/131,411.
Apr. 30, 2015 Office Action issued in Chinese Application No. 201310084558.8.
Jul. 2, 2015 Office Action issued in U.S. Appl. No. 13/131,411.

* cited by examiner

EPITAXIAL SUBSTRATE FOR ELECTRONIC DEVICE AND METHOD OF PRODUCING THE SAME

This is a Continuation of application Ser. No. 13/131,411 filed May 26, 2011, which is a National Phase of Application No. PCT/JP2009/069896 filed Nov. 18, 2009. The disclosures of the prior applications are hereby incorporated by reference herein in their entirety.

BACKGROUND OF THE INVENTION

Field of the Invention

The present invention relates to an epitaxial substrate for an electronic device and a method of producing the same and, in particular, to an epitaxial substrate for a HEMT and a method producing the same.

Description of the Related Art

Figure 1:
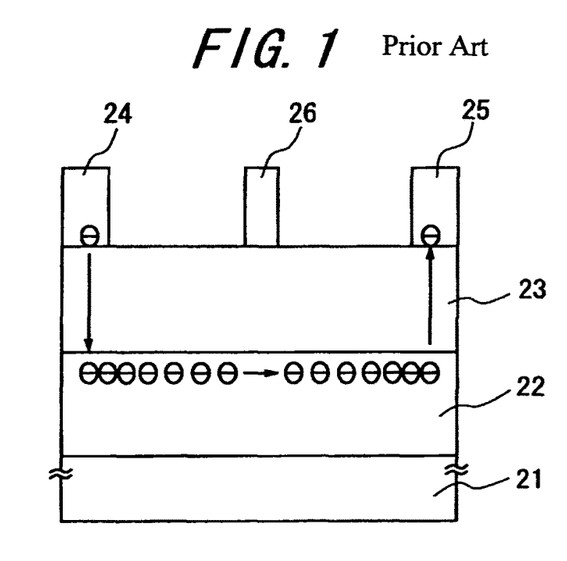
FIG. 1 is a schematic sectional view showing a typical field effect transistor (FET).

In recent years, HEMT (High electron mobility transistor) has been widely used as high-speed FET (Field effect transistor) as speed required of an IC device increases. Such a FET-type transistor as described above is generally formed, as schematically illustrated in FIG. 1, for example, by laminating a channel layer 22 and an electron supply layer 23 on an insulating substrate 21 and then providing a surface of the electron supply layer 23 with a source electrode 24, a drain electrode 25 and a gate electrode 26. When this transistor device is operated, electrons are moved through the source electrode 24, the electron supply layer 23, the channel layer 22, the electron supply layer 23 and the drain electrode 25 in this order, thereby defining a lateral direction of the device as a main current conducting direction. This movement of electrons in the lateral direction, i.e. the main current conducting direction, is controlled by voltage applied on the gate electrode 26. In a HEMT, electrons generated at a joint interface between the electron supply layer 23 and the channel layer 22 of which band gaps are different from each other can move significantly fast, as compared with electrons in a conventional semiconductor.

An epitaxial substrate formed by epitaxially growing a Group III nitride laminated body on a semiconductor substrate is generally used as an epitaxial substrate for a FET. Examples of such a semiconductor substrate as described above include: a Si substrate having specific resistance exceeding $10^2$ Ω·cm for use to decrease substrate loss which deteriorates device performances, as disclosed in JP 2008-522447 Laid-Open; and a Si substrate having specific resistance of 1.0 to 500 Ω·cm or so for use to decrease leak current to the Si substrate, as disclosed in JP 2003-059948 Laid-Open.

It has been conventionally considered that use of a Si substrate having relatively high specific resistance is preferable, as described above. However, it has been known that, when layers having different specific resistance values are epitaxially grown on a Si substrate having a predetermined resistance, mismatch of lattice constants generally occurs between the Si substrate and the epitaxially-grown layers, whereby warp(s) is generated to alleviate strains. Such warpage of an epitaxial substrate as described above causes maladsorption and/or exposure failure at the stage of a device process.

In order to solve the problems described above, JP 06-112120 Laid-open discloses a technique for decreasing the absolute value of warpage by determining in advance a warping direction in a semiconductor substrate and then adequately growing epitaxial layers on the substrate.

However, the technique disclosed in JP 06-112120 Laid-open simply aims at decreasing the absolute value of warpage of an epitaxial substrate and determines in advance only warpage derived from a slicing process of slicing a wafer from an ingot. Therefore, JP 06-112120 Laid-open cannot control a final warp configuration of the epitaxial substrate in a sufficient manner. JP 06-112120 Laid-open also has a problem that a production process thereof is complicated because it includes a process of determining a warping direction of the semiconductor substrate.

SUMMARY OF THE INVENTION

Problems to be Solved by the Invention

An object of the present invention is to solve the aforementioned problems and provide an epitaxial substrate for an electronic device, in which substrate a lateral direction thereof is defined as a main current conducting direction and a warp configuration thereof is adequately controlled, and a method of producing the epitaxial substrate.

Means for Solving the Problems

In order to achieve the object described above, the present invention is primarily structured as follows.

(1) An epitaxial substrate for an electronic device, including: a Si single crystal substrate; and a Group III nitride laminated body formed by epitaxially growing plural Group III nitride layers on the Si single crystal substrate, wherein a lateral direction of the epitaxial substrate is defined as a main current conducting direction, is characterized in that the Si single crystal substrate is a p-type substrate having a specific resistance value of not larger than 0.01 Ω·cm.

(2) The epitaxial substrate for an electronic device of (1) above, wherein a sectional warp configuration of the epitaxial substrate satisfies a relationship formula below.

$$||Bowl - SORI| \leq 2 \; \mu m$$

(3) The epitaxial substrate for an electronic device of (1) or (2) above, wherein a sectional warp configuration of the epitaxial substrate is monotonously bowed over the entire width of the epitaxial substrate.

(4) The epitaxial substrate for an electronic device of any of (1) to (3) above, wherein the Si single crystal substrate contains as an impurity element boron at a concentration of $10^{19}/cm^3$ or higher.

(5) The epitaxial substrate for an electronic device of any of (1) to (4) above, further comprising a buffer as an insulating layer between the Si single crystal substrate and the Group III nitride laminated body.

(6) The epitaxial substrate for an electronic device of (5) above, wherein the buffer includes a lamination constituted of a superlattice multilayer structure.

(7) A method of producing an epitaxial substrate for an electronic device, in which a Group III nitride laminated body is formed by epitaxially growing plural Group III nitride layers on a Si single crystal substrate such that a lateral direction of the substrate is defined as a main current conducting direction, comprising forming the Si single crystal substrate to be a p-type substrate having a specific resistance value of not larger than 0.01 Ω·cm by adding boron thereto at a relatively high concentration.

(8) The method of producing an epitaxial substrate for an electronic device of (7) above, wherein boron is added at a concentration of $10^{19}/cm^3$ or higher.

(9) The method of producing an epitaxial substrate for an electronic device of (7) or (8) above, further comprising: forming on the Si single crystal substrate a buffer as an insulating layer including a lamination constituted of a superlattice multilayer structure, prior to formation of the Group III nitride laminated body; and forming the Group III nitride laminated body having a HEMT structure on the buffer.

Effect of the Invention

According to the present invention, a warp configuration of an epitaxial substrate for an electronic device can be appropriately controlled without deteriorating performances of the device, by setting a specific resistance value of a Si single crystal substrate at a preferred value or lower.

Specifically, according to the present invention, a warp configuration of an epitaxial substrate for an electronic device can be appropriately controlled by setting a specific resistance value of a Si single crystal substrate at a preferred value or lower by adding boron to the Si single crystal substrate at a relatively high concentration.

BEST MODE FOR IMPLEMENTING THE PRESENT INVENTION

Figure 2:
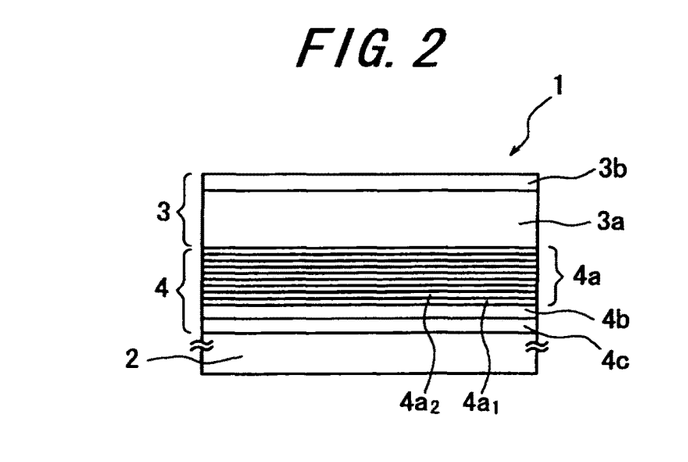
FIG. 2 is a schematic sectional view of an epitaxial substrate for an electronic device according to the present invention.

An embodiment of an epitaxial substrate for an electronic device of the present invention will be described with reference to the drawings hereinafter. FIG. 2 schematically shows a sectional structure of an epitaxial substrate for an electronic device according to the present invention.

As shown in FIG. 2, an epitaxial substrate 1 for an electronic device of the present invention, including: a Si single crystal substrate 2; and a Group III nitride laminated body 3 formed by epitaxially growing plural Group III nitride layers on the Si single crystal substrate 2, wherein a lateral direction of the epitaxial substrate is defined as a main current conducting direction, is characterized in that the Si single crystal substrate 2 is a p-type substrate having a specific resistance value of not larger than 0.01 Ω·cm. The present invention is based on a discovery that, in an epitaxial substrate for an electronic device, having such a structure as described above, a warp configuration thereof can be appropriately controlled without deteriorating performances of the device.

In the present invention, "a lateral direction is defined as a main current conducting direction" means that electric current flows from the soured electrode to the drain electrode, i.e. predominantly in the widthwise direction of the laminated body, differing from, for example, a structure in which a semiconductor is interposed by a pair of electrodes such that electric current flows predominantly in the vertical direction, i.e. in the thickness direction of the laminated body.

A value of specific resistance of the Si single crystal substrate 2 is adjusted by adding a p-type impurity element to the Si single crystal substrate. Examples of the p-type impurity element include boron, aluminum, gallium, and the like. Among these examples, boron is preferably used because boron can be added at a relatively high concentration. In this regard, it is preferable to add boron at a concentration of $10^{19}/cm^3$ or higher in order to adjust a specific resistance value of the Si single crystal substrate 2 to not larger than 0.01 Ω·cm. The dimension of the Si single crystal substrate 2 can be appropriately selected depending on applications. A face, for use, of the Si single crystal substrate is not particularly specified and any face such as (111) face, (100) face, (110) face can be used. Use of (111) face is, however, preferable because then growth of (0001) face of Group III nitride is easily facilitated and surface-flatness of an epitaxial substrate improves. Further, it is acceptable to bond a substrate made of another material on the back surface of the Si single crystal substrate 2 and/or provide the Si single crystal substrate with a protection film such as an oxide film, a nitride film, or the like.

Figure 3:
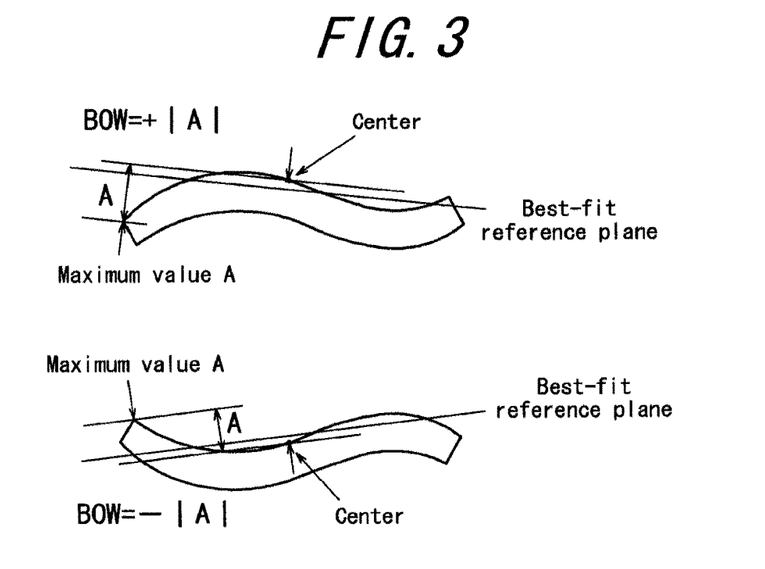
FIG. 3 is a schematic view for explaining "BOW".
Figure 4:
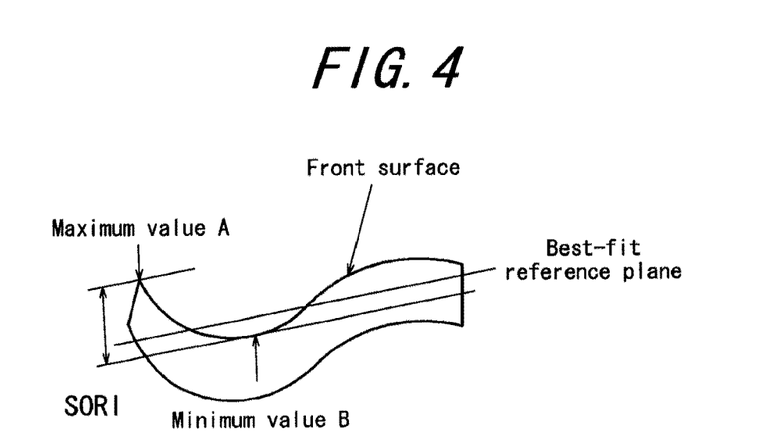
FIG. 4 is a schematic view for explaining "SORI".

A warp configuration of an epitaxial substrate for an electronic device can be optimized by adjusting a specific resistance value of the Si single crystal substrate 2 to not larger than 0.01 Ω·cm, as described above. In the present embodiment, appropriateness of a warp configuration is defined by the absolute value of a value obtained by subtracting "SORI" as shown in FIG. 4 from the absolute value of "BOW" as shown in FIG. 3. A "BOW" value represents, as shown in FIG. 3, a value obtained by: measuring the largest distance between a plane, passing through the center in the widthwise direction of a measurement surface of an epitaxial substrate and in parallel with the best-fit reference plane, and the measurement surface in a non-adsorbed state of the epitaxial substrate; and imparting the distance value with a sign +/− depending on the vertical direction with respect to the center. On the other hand, a "SORI" value represents a distance in the vertical direction between a plane, passing through the highest position of a measurement surface of an epitaxial substrate and in parallel with the best-fit reference plane, and a plane, passing through the lowest position of the measurement surface and in parallel with the best-fit reference plane in a non-adsorbed state of the epitaxial substrate, as shown in FIG. 4.

A sectional warp configuration of the epitaxial substrate 1 for an electronic device according to the present invention preferably satisfies a relationship formula below.

$$||Bow|-|SORI||\leq 2$$

It should be noted that peripheral portions of the epitaxial substrate, within 3 mm measured from edges of the substrate, are to be excluded in measurement of the BOW and SORI values because deformation in a relatively narrow range may be generated in the peripheral portion of the epitaxial substrate due to a SORI configuration of the Si single crystal substrate itself, a processed configuration of edges of the substrate, and the like.

Figure 5:
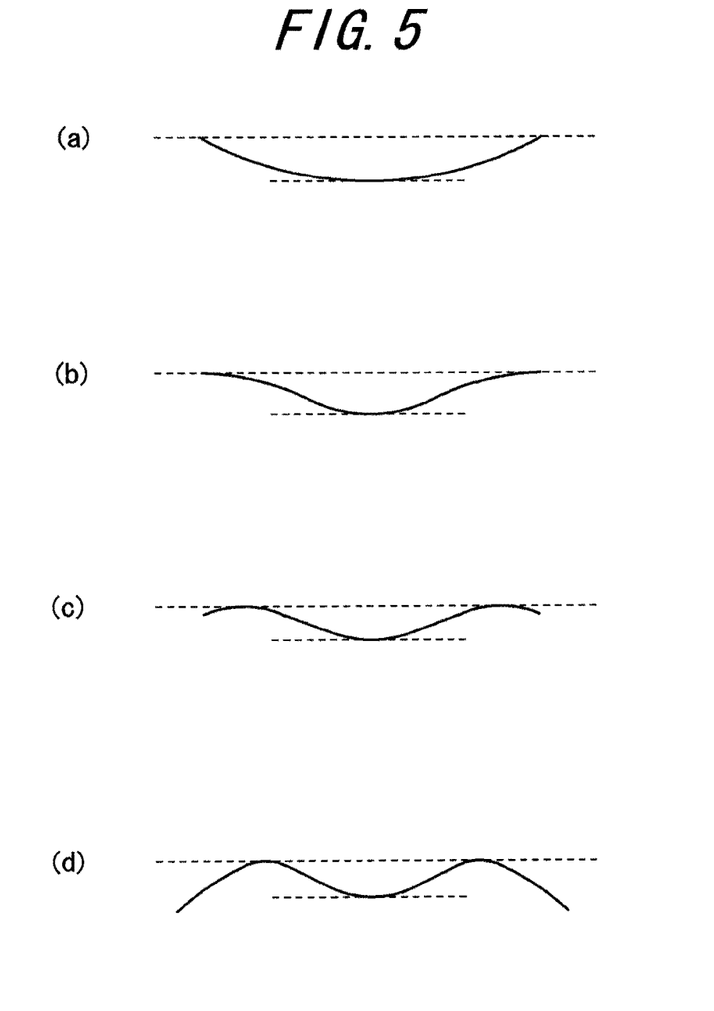
FIGS. 5(a) to 5(d) are views of sectional warp configurations of various types.
Figure 6:
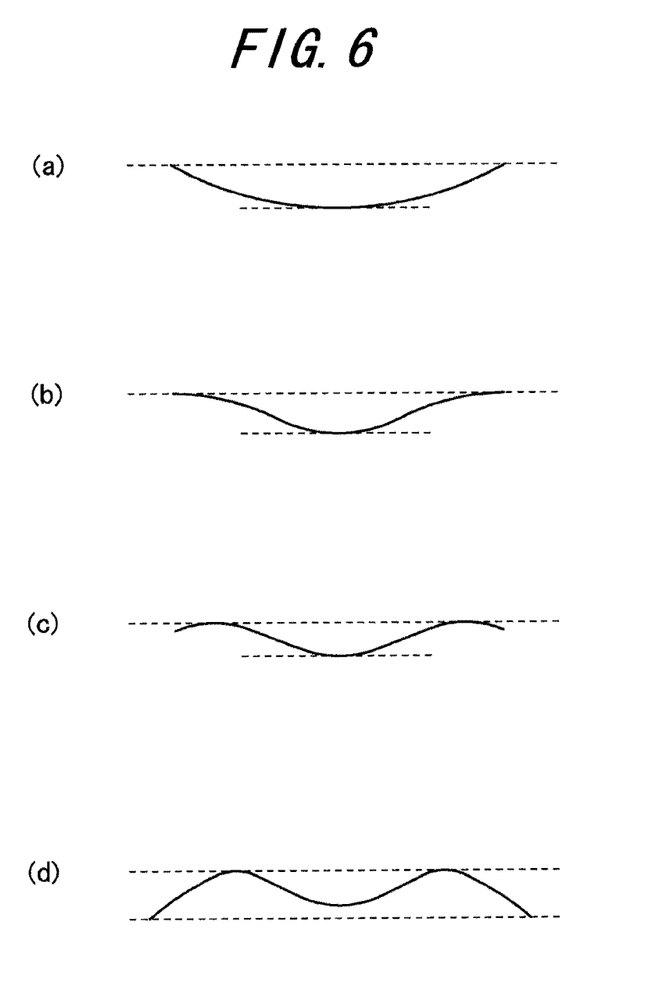
FIGS. 6(a) to 6(d) are views of sectional warp configurations of various types.

FIGS. 5(a) to 5(d) are views of sectional warp configurations of various types. FIGS. 6(a) to 6(d) are actually views of the same sectional warp configurations as those of FIGS. 5(a) to 5(d). Broken lines in FIG. 5 and FIG. 6 are used to measure BOW values and SORI value. FIGS. 5(a)

to 5(c) and FIGS. 6(a) to 6(c) each represent a case where a value of |Bow| and a value of SORI are equal to each other. FIG. 5(d) and FIG. 6(d) each represent a case where a value of |Bow| and a value of SORI are different from each other. A sectional warp configuration of the epitaxial substrate 1 for an electronic device is preferably bowed monotonously in one direction, as show in FIG. 5(a) and FIG. 6(a). In contrast, in a case where a sectional warp configuration is bowed in two directions as shown in FIG. 5(d) and FIG. 6(d), a value of |Bow| differs from a value of SORI, whereby the larger absolute value of the difference between |Bow| and SORI results in the more unevenness in the two directions of the sectional warp configuration. If ||Bow|−SORI| exceeds 2 μm, such an unevenly warped configuration of the epitaxial substrate may deteriorate performances of the device and cause maladsorption and exposure failure at the stage of a device process.

A sectional warp configuration of the epitaxial substrate for an electronic device is preferably bowed monotonously over the entire width thereof, as show in FIG. 5(a) and FIG. 6(a), so that warp can be easily corrected to suppress exposure failure of the device due to maladsorption. The peripheral portions of the epitaxial substrate, within 3 mm measured from edges of the substrate, are to be excluded in consideration of the sectional warp configuration of the epitaxial substrate, as described above.

It is preferable to further provide a buffer 4 as an insulating layer between the Si single crystal substrate 2 and the Group III nitride laminated body 3. Provision of the buffer 4 as an insulating layer prevents electric current from flowing into the Si single crystal substrate 2, suppresses leak current in the vertical direction which could be facilitated by use of the Si substrate having relatively low specific resistance, and improves breakdown voltage of the substrate.

The buffer 4 preferably includes a lamination 4a constituted of a superlattice multilayer structure. The lamination 4a may be formed as alternately laminated layers including at least a first layer $4a_1$ made of a $B_{a1}Al_{b1}Ga_{c1}In_{d1}N$ material ($0 \le a_1 \le 1$, $0 \le b_1 \le 1$, $0 \le c_1 \le 1$, $0 \le d_1 \le 1$, $a_1+b_1+c_1+d_1=1$) and a second layer $4a_2$ made of a $B_{a2}Al_{b2}Ga_{c2}In_{d2}N$ material ($0 \le a_2 \le 1$, $0 \le b_2 \le 1$, $0 \le c_2 \le 1$, $0 \le d_2 \le 1$, $a_2+b_2+c_2+d_2=1$) having a band gap different from that of the first layer. Differentiating a band gap of one layer from that of another layer, i.e. band discontinuities, contributes to increase in electric resistance in the vertical direction. In this regard, the superlattice multilayer structure preferably contains C (carbon) at a concentration of $1 \times 10^{18}/cm^3$ or more because then generation of carriers due to band discontinuities is suppressed and breakdown voltage of the buffer can be further improved. Although the upper limit of the C concentration is not particularly limited, the upper limit thereof is preferably not higher than $1 \times 10^{20}/cm^3$ in terms of suppressing generation of pits in the Group III nitride laminated body 3. Formation of the conventional superlattice generally involves steep changes in interfaces thereof. The present invention, in addition to this, may further include cases where another layer is inserted between interfaces, a composition of an interface is continuously varied, a composition of the superlattice multilayer structure is varied, and the like, within a scope not marring the technical effect of the present invention.

In terms of improving breakdown voltage of the substrate, in particular, thickness of a layer having a relatively large band gap, of the lamination 4a, is preferably equal to or larger than the thickness capable of suppressing tunneling current and equal to or smaller than the thickness which reliably avoids generation of cracks. For example, a layer having a relatively large band gap, of the lamination 4a, is preferably formed by using AlN having the largest band gap among the Group III nitrides so as to have a thickness of 2 to 10 nm. Further, from a similar viewpoint, a layer having a relatively small band gap, of the lamination 4a, preferably contains at least Al so that carbon can be effectively incorporated at a sufficiently high concentration.

A layer having a relatively small band gap, of the lamination 4a, is preferably thicker than a layer having a relatively large band gap, of the lamination 4a, and equal to or thinner than 40 nm in order to effectively demonstrate a strain-alleviating effect of the superlattice multilayer structure and suppress generation of cracks. Further, for similar reasons, difference in composition between a layer having a relatively small band gap and a layer having a relatively large band gap, of the lamination 4a, is necessary and difference in composition of Al therebetween is preferably at least 50%, i.e. $|b_1-b_2| \le 0.5$.

The number of laminated-layer pairs of the superlattice multilayer structure is not particularly restricted. The larger number of such pairs results in the better suppression of leak current in the vertical direction and improvement of breakdown voltage.

Next, another embodiment regarding a method of producing an epitaxial substrate for an electronic device of the present invention will be described with reference to the drawings. As shown in FIG. 2, the epitaxial substrate 1 for an electronic device of the present invention, in which a lateral direction of the epitaxial substrate 1 is defined as a main current conducting direction, is characteristically produced by: forming a Si single crystal substrate 2 to be a p-type substrate having a specific resistance value of not larger than 0.01 Ω·cm by adding boron thereto at a relatively high concentration; and epitaxially growing plural Group III nitride layers on the Si single crystal substrate 2 to form a Group III nitride laminated body 3. Due to such a structure as described above, the epitaxial substrate for an electronic device of the present invention can adequately control a warp configuration thereof without deteriorating performances of the device.

It is preferable that boron is added at a concentration of $10^{19}/cm^3$ or more so as to evenly exist across the entire region of the substrate. Boron may be either added as an impurity to Si single crystal when the Si single crystal is produced by the CZ method, the FZ method or the like, or introduced to the substrate by ion injection, thermal diffusion, or the like. In the present embodiment, boron need not be added across the entire region of the Si single crystal substrate at the preferred B content described above and it suffices that boron is added at the preferred content to at least a portion of the substrate. For example, the present invention includes an application where a substrate containing boron at the aforementioned concentration or more is provided with a Si film formed thereon of which boron content is lower than the aforementioned concentration and an application where portions having B content lower than the aforementioned preferred content locally exist within the Si substrate. Further, the present invention includes an application where a surface-modified layer such as a Si nitride film, a carbide film, an oxide film or the like is formed as an initial layer on the substrate surface and an application where the substrate includes a material other than Si and Group III nitrides. Yet further, the epitaxial substrate for an electronic device of the present invention may contain impurities other than B, such as Al, Ga, In, P, Sb, As, H, C, Ge, N, O and the like. Impurities are preferably added in order to increase hardness of the Si single crystal substrate.

It is preferable that a buffer as an insulating layer including a lamination constituted of a superlattice multilayer structure is formed on the Si single crystal substrate prior to formation of the Group III nitride laminated body and thereafter the Group III nitride laminated body having a HEMT structure is formed on the buffer. Each of the lamination of a superlattice multilayer structure and the Group III nitride laminated body of a HEMT structure can be formed by a thin-film laminating method of various types, such as MOCVD, MBE, HVPE and the like.

FIGS. 1 to 6 show typical examples of the embodiments and the present invention is not restricted to these illustrated examples of the embodiments.

EXAMPLES

Example 1

A Si single crystal substrate of 3-inch diameter (plate thickness: 625 μm, content of added boron: $2\times10^{19}$/cm$^3$: specific resistance: 0.005 Ω·cm, crystal face (111)) was heated in an atmosphere of hydrogen and nitrogen at 1050° C. Thereafter, an AlN layer having film thickness 200 nm and an $Al_{0.25}Ga_{0.75}N$ layer having film thickness 50 nm were formed on the Si single crystal substrate by adjusting supply rates of trimethylgallium (TMG), trimethylaluminum (TMA) and NH$_3$ by using the MOCVD method. Further, an insulating superlattice multilayer structure as a lamination of 80 pairs of alternately laminated an AlN film (film thickness: 4 nm) and an $Al_{0.15}Ga_{0.85}N$ film (film thickness: 25 nm) was formed on the $Al_{0.25}Ga_{0.75}N$ layer by adjusting supply rates of trimethylgallium (TMG), trimethylaluminum (TMA) and NH$_3$. The average Carbon concentration of the superlattice multilayer structure was $2\times10^{18}$/cm$^3$. A GaN layer of 1.5 μm thickness and an $Al_{0.25}Ga_{0.75}N$ layer (film thickness 20 nm) functioning as lateral-direction current conducting layers were formed on the superlattice multilayer structure, whereby an epitaxial substrate for an electronic device was prepared.

Example 2

An epitaxial substrate for an electronic device was prepared in the same manner as in Example 1, except that the content of added boron was $1\times10^{19}$/cm$^3$ and specific resistance of the Si single crystal substrate was 0.01 Ω·cm.

Comparative Example 1

An epitaxial substrate for an electronic device was prepared in the same manner as in Example 1, except that the content of added boron was $4\times10^{18}$/cm$^3$ and specific resistance of the Si single crystal substrate was 0.02 Ω·cm.

Comparative Example 2

An epitaxial substrate for an electronic device was prepared in the same manner as in Example 1, except that the content of added boron was $1.5\times10^{16}$/cm$^3$ and specific resistance of the Si single crystal substrate was 1 Ω·cm.

Comparative Example 3

An epitaxial substrate for an electronic device was prepared in the same manner as in Example 1, except that the content of added boron was $8\times10^{14}$/cm$^3$ and specific resistance of the Si single crystal substrate was 25 Ω·cm.

Comparative Example 4

An epitaxial substrate for an electronic device was prepared in the same manner as in Example 1, except that the content of added boron was $1\times10^{13}$/cm$^3$ and specific resistance of the Si single crystal substrate was 5000 Ω·cm.

Evaluation

A warp configuration of each of the epitaxial substrates for electronic devices of Examples 1, 2 and Comparative Examples 1 to 4 was observed by using a configuration measuring device (FT-900: manufactured by NIDEC Corporation), so that the BOW value and the SORI value were obtained, respectively. FIGS. 7(a) to 7(d) show surface contour lines and sectional warp configurations of the epitaxial substrates of Example 1, Comp. Example 1, Comp. Example 2 and Comp. Example 4 obtained by the configuration measuring device, respectively. Table 1 show the measurement results of the BOW values and the SORI values of these epitaxial substrates.

Ten samples were prepared for each of the epitaxial substrates for electronic devices of Examples 1, 2 and Comparative Examples 1 to 4 in order to analyze variation in configuration of the Si single crystal substrate itself, and these samples were evaluated as described above. Table 2 show ranges from the minimum value to the maximum value of "specific resistance" and "||Bow|−SORI|", respectively.

TABLE 1

|  | Specific resistance (Ω/cm) | BOW (μm) | SORI (μm) | ||Bow| − SORI| (μm) |
|---|---|---|---|---|
| Example 1 | 0.005 | −17.89 | 17.94 | 0.05 |
| Example 2 | 0.01 | −18.90 | 19.00 | 0.10 |
| Comp. Example 1 | 0.02 | −4.85 | 14.08 | 9.23 |
| Comp. Example 2 | 1 | −8.29 | 18.56 | 10.27 |
| Comp. Example 3 | 25 | −8.29 | 23.56 | 15.27 |
| Comp. Example 4 | 5000 | 30.60 | 50.00 | 19.40 |

TABLE 2

|  | Specific resistance (Ω/cm) | ||Bow| − SORI| (μm) |
|---|---|---|
| Example 1 | 0.005 | 0-0.5 |
| Example 2 | 0.01 | 0-2 |
| Comp. Example 1 | 0.02 | 5-15 |
| Comp. Example 2 | 1 | 5-20 |
| Comp. Example 3 | 25 | 10-30 |
| Comp. Example 4 | 5000 | 15-40 |

Figure 7:
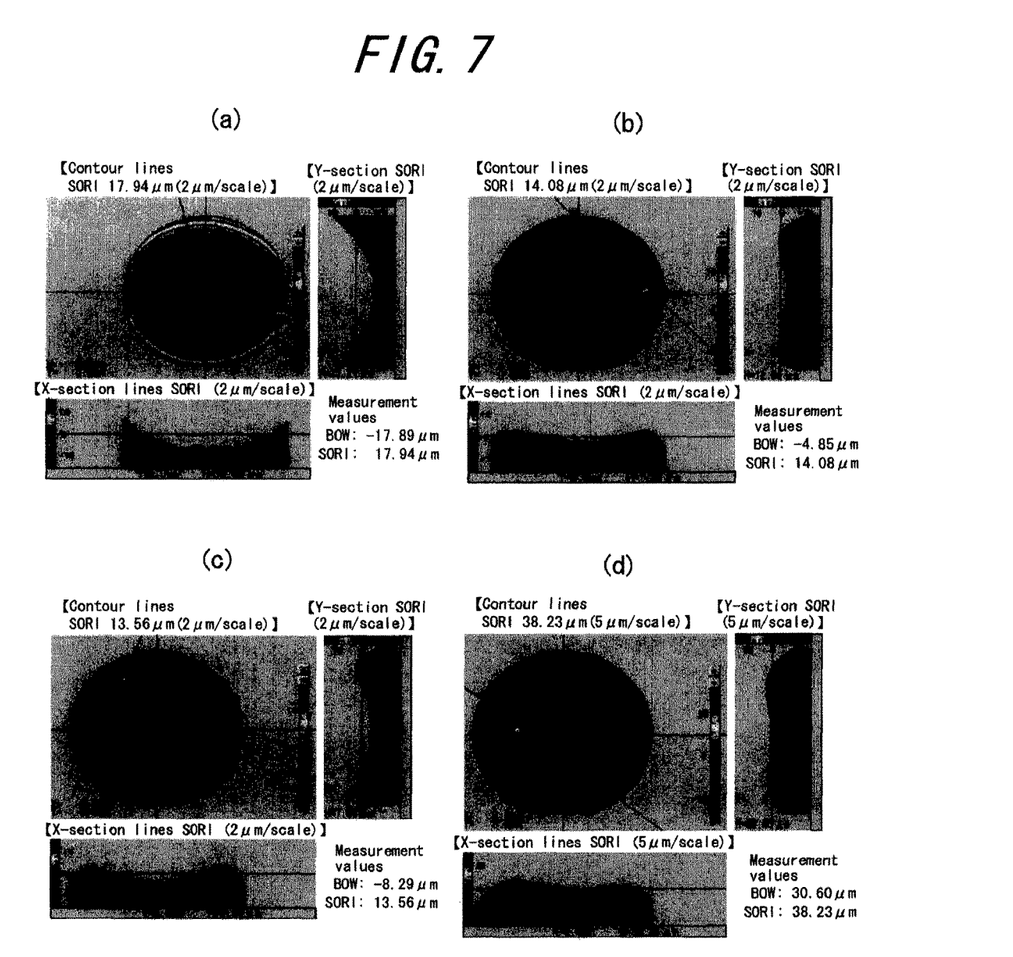
FIGS. 7(a) to 7(d) are views each showing surface contour lines and a sectional configuration of the epitaxial substrate for an electronic device, measured by using a configuration measuring device.

It is understood from FIG. 7(a) that the sectional warp configuration of the epitaxial substrate for an electronic device of Example 1 of the present invention is monotonously bowed in one direction. It is also understood from FIGS. 7(b) to 7(d) that the sectional warp configurations of the epitaxial substrates for electronic devices of Comp. Example 1, Comp. Example 2 and Comp. Example 4 are not monotonously bowed in one direction. Further, it is understood from Tables 1 and 2 that Examples 1 and 2 according to the present invention can reduce a value itself of and variation in ||Bow|−SORI|, as compared with Comp. Examples 1 to 4, by adjusting a specific resistance value of the Si single crystal substrate to not larger than 0.01 Ω·cm.

Thickness and dimensions of the epitaxial substrate for an electronic device of the present invention are not particularly restricted to those in Examples described above and may be appropriately selected depending applications in use.

INDUSTRIAL APPLICABILITY

According to the present invention, a warp configuration of an epitaxial substrate for an electronic device can be appropriately controlled without deteriorating performances of the device, by setting a specific resistance value of a Si single crystal substrate at a preferred value or lower.

EXPLANATION OF REFERENCE NUMERALS

1 Epitaxial substrate for electronic device
2 Si single crystal substrate
3 Group III nitride laminated body
3a Channel layer
3b Electron supply layer
4 Buffer
4a Lamination constituted of superlattice multilayer structure
4b Intermediate layer
4c Seed layer

The invention claimed is:
1. An epitaxial substrate for an electronic device, including:
a Si single crystal substrate; and
a Group III nitride laminated body comprising a plurality of Group III nitride layers on only one major surface of the Si single crystal substrate, wherein a lateral direction of the epitaxial substrate is defined as a main current conducting direction, wherein:
the epitaxial substrate further comprises a buffer as an insulating layer between the Si single crystal substrate and the Group III nitride laminated body,
the buffer includes a lamination constituted of a superlattice multilayer structure containing carbon at a concentration of $1 \times 10^{18}/cm^3$ or more,
the Si single crystal substrate is a p-type substrate having a specific resistance value of not larger than 0.01 Ω·cm,
an other major surface of the Si single crystal substrate being opposite to the one major surface is exposed; or a protection film made of an oxide film or a silicon-nitride film is further provided on the other major surface, and a surface of the protection film that is not facing the other major surface is exposed,
the plurality of Group III nitride layers include a first Group III nitride layer and a second Group III nitride layer, wherein the first Group III nitride layer is arranged between the buffer and the second Group III nitride layer such that the second Group III nitride layer does not directly contact a major surface of the superlattice multilayer structure opposite the one major surface of the Si single crystal substrate, and
the first Group III nitride layer is a channel layer and is in direct contact with the buffer.
2. The epitaxial substrate for an electronic device of claim 1, wherein the Group III nitride layers are layers containing at least Al or Ga.
3. The epitaxial substrate for an electronic device of claim 1, wherein the specific resistance value of the Si single crystal substrate is 0.005 Ω·cm or less.

* * * * *